(12) United States Patent  (10) Patent No.: US 7,977,849 B2
Hailes et al.  (45) Date of Patent: Jul. 12, 2011

| | | | |
|---|---|---|---|
| (54) | DROPLET SPRAY GENERATION DEVICE | (30) | Foreign Application Priority Data |
| (75) | Inventors: Anthony Hailes, Hertfordshire (GB); Martin Scott Goodchild, Cambridgeshire (GB) | Mar. 19, 2007 (GB) .................................. 0705102.2 (51) Int. Cl. *H01L 41/09* (2006.01) |  |
| (73) | Assignee: The Technology Partnership PLC, Hertfordshire (GB) | (52) U.S. Cl. ...................................................... 310/317 (58) Field of Classification Search .................... 310/317 See application file for complete search history. |  |
| ( * ) | Notice: Subject to any disclaimer, the term of this patent is extended or adjusted under 35 U.S.C. 154(b) by 109 days. | (56) References Cited U.S. PATENT DOCUMENTS |  |
| (21) | Appl. No.: 12/528,334 | 4,767,959 A * 8/1988 Sakakibara et al. .......... 310/317 7,550,897 B2 * 6/2009 Hailes .......................... 310/317 |  |
| (22) | PCT Filed: Mar. 10, 2008 | * cited by examiner |  |
| (86) | PCT No.: PCT/GB2008/050165 § 371 (c)(1), (2), (4) Date: Aug. 24, 2009 | *Primary Examiner* — Derek J Rosenau (57) ABSTRACT |  |
| (87) | PCT Pub. No.: WO2008/114044 PCT Pub. Date: Sep. 25, 2008 | An electronic drive system for a droplet spray generation device has a droplet generator with a perforate membrane driven by a piezoelectric transducer. An electronic circuit controls a power supply to control the charging of a capacitor to supply a drive signal to the piezoelectric transducer. The electronic circuit is arranged to control the operation of the power amplifier at substantially its resonant frequency. |  |
| (65) | Prior Publication Data US 2010/0140291 A1 Jun. 10, 2010 | 7 Claims, 4 Drawing Sheets |  |

DROPLET SPRAY GENERATION DEVICE

BACKGROUND

The present invention relates to an electronic drive system for droplet spray generation and, more particularly to an electronic drive system for use in a droplet spay generator for an air-freshening device.

An aim of the present invention is to provide a low cost electronic drive system for a droplet generator using a micro-controller to implement signal generation and timing elements of a circuit to drive the droplet generator.

Spray generators of the general type to which the present invention relates may, for example, be of the type described in EP-A-0615470.

WO-A-2005/097348 describes an electronic drive system for a droplet spray generation device of the type having a droplet generator including a perforate membrane driven by a piezoelectric transducer, the electronic drive system comprising a programmable micro-controller, a power supply for converting, in use, a battery supply voltage to power the device, a power amplifier connected to receive electric power from the power supply and supply a drive signal to the piezoelectric generator in use; and wherein the micro-controller is also arranged to control the operation of the power amplifier, including the drive signal operating frequency at substantially its resonant frequency, to measure the current provided to the power amplifier by the power supply at a plurality of different frequencies, to determine, as the resonant frequency of the droplet generator, the frequency at which the maximum power is consumed by the amplifier, and to set the drive signal operating frequency at the resonant frequency. Such a system effectively therefore determines the resonant frequency to use based on current measurement.

SUMMARY OF THE INVENTION

However, if increased design flexibility (for instance to enable lower cost electronics) is required then, according to the present invention there is provided an electronic drive system for a droplet spray generation device, the drive system comprising a droplet generator having a perforate membrane driven by a piezoelectric transducer; an electronic circuit controlling a power supply to control the charging of a capacitor to a supply voltage providing power to a power amplifier connected to receive electric power from the capacitor and supply a drive signal to the piezoelectric transducer in use; and wherein the electronic circuit is also arranged to control the operation of the power amplifier including the drive signal operating frequency at substantially its resonant frequency, where the resonant frequency is calculated by measuring and/or timing changes to the voltage across the capacitor when the droplet generator is operated in a plurality of bursts at different frequencies, by charging the capacitor to a given voltage, and either actuating the droplet generator for a given time and either measuring the voltage drop across the capacitor at the end of the given time or the time taken to recharge the capacitor to the set value thereafter, or actuating the droplet generator and measuring the time taken for the voltage to fall to a known value, and determining as the resonant frequency of the droplet generator, the frequency at which respectively the time to recharge is the greatest, or the voltage drop is the greatest, or the time taken for the voltage to fall to the known value is shortest, and to set the drive signal operating frequency at the resonant frequency thus determined.

The frequency search algorithm may determine the resonant frequency of the spray head at which maximum power is consumed by estimating the power consumed at each test frequency by charging the power supply capacitor to a set voltage, switching the output on for a set time, and then measuring the time taken for the capacitor to be charged up to another set voltage. The test frequency at which the longest recharge time is measured is then set as the resonant frequency.

A second method to estimate the power consumed at each test frequency is to charge the power supply capacitor to a set voltage, to switch the output on for a set time, and then to measure the capacitor voltage. The test frequency at which the lowest voltage value is measured is then set as the resonant frequency.

A third method to estimate the power consumed at each test frequency is to charge the power supply capacitor to a set voltage, to switch the output on until the capacitor reaches a second set voltage, and to record the time taken for the capacitor to reach this second voltage. The test frequency at which the shortest time is then set as the resonant frequency.

Such a system also enables a wider choice of DC/DC converter design to be employed within the power supply. For example designs using pulse width modulation, pulse frequency modulation and trickle chargers may be used.

By using a micro-controller the components of the present invention cost less than the expected cost of a device using a custom application specific integrated circuit (ASIC) providing the same functionality in all but very high production volumes.

The power amplifier preferably comprises a resonant bridge circuit and the micro-controller outputs in use a pair of signals in anti-phase to the resonant bridge circuit to control the amplifier.

The drive system may be used to power and control a droplet generator for an air freshening device, in which case, preferably, the electronic drive system includes a multi-position switch connected to the micro-controller to control a timer provided by the micro-controller to set the interval at which the drive signal is provided to the power amplifier to control the interval at which the droplet generator is automatically operated.

The micro-controller may also provide a second timer to generate the drive signal, on demand, as a plurality of pulses of fixed interval over a predetermined period shorter than the interval at which the droplet generator is automatically operated, the second timer being operated by a mono-stable switch connected to the micro-controller.

The power supply is preferably controlled by the micro-controller and uses an integrated pulse frequency mode.

By using a micro-controller device and using just a single pin to interrogate the multi position and mono-stable switches a micro-controller with only six I/O pins may be used.

The power available from batteries is maximised by using the micro-controller's "sleep" mode, but waking it up under the control of a timed "watchdog" interrupt and whenever the mono-stable switch is pressed.

BRIEF DESCRIPTION OF THE DRAWINGS

An example of the droplet spray generation device incorporating a drive system according to the invention will now be described with reference to the accompanying drawings in which:

FIG. 1 illustrates a cross-sectional view of the droplet generator;

FIG. 2 is a block diagram of the device;

FIG. 3 is a signal diagram illustrating various voltages during the operation to establish the resonant frequency; and, FIG. 4 is a UML "activity" diagram illustrating the process followed by the micro-controller to determine the resonant frequency.

DETAILED DESCRIPTION

Figure 1:
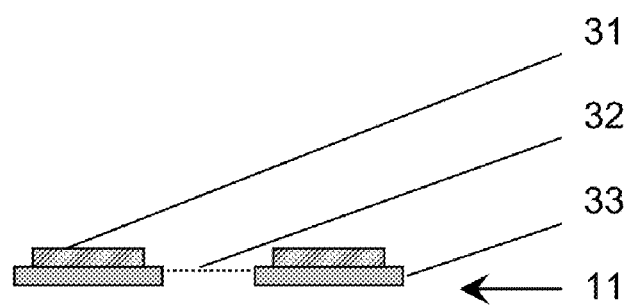
Figure 2:
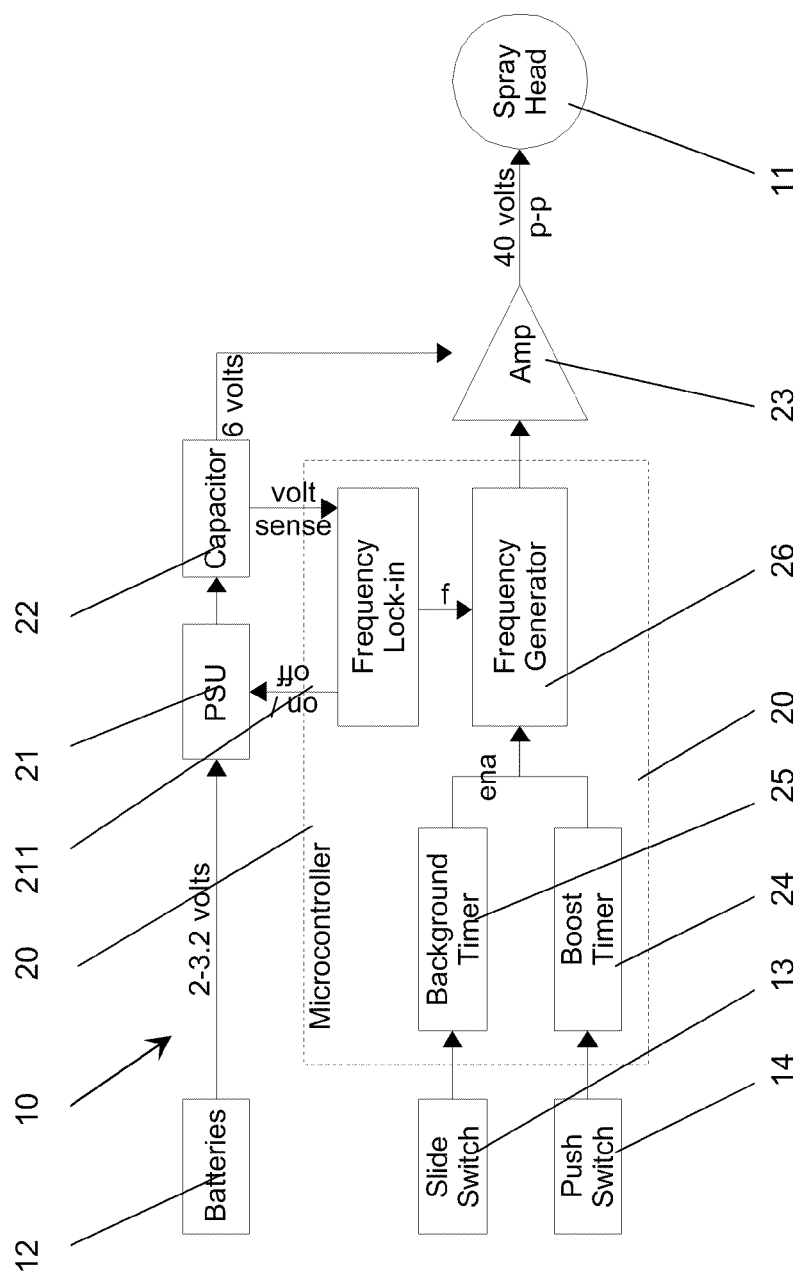

As seen in FIG. 1 and FIG. 2, an air-freshening device 10 is provided for spraying air-freshening fluid through a spray head 11. The spray head 11 comprises a perforate membrane 32 coupled to an annular piezoelectric transducer 31 mounted on a substrate 33. When the transducer is activated, air-freshening fluid is sprayed from a reservoir (not shown) through the perforate membrane 32 to the outside environment.

The block diagram of FIG. 2 shows the spray head 11 controlled by a micro-controller 20 (explained in more detail below) and is powered by two "AA" alkaline batteries 12 providing in the range of 2-3.2 volts. Micro-controller 20 is, for example, an Atmel "ATmega168" with 32 I/O pins and operating at 10 MHz. This contains all of the functional blocks required to implement the features described here.

In an air-freshener of this type, there may be a requirement that the device 10 sprays fluid through the spray head 11 in two different modes. A background mode is therefore provided wherein a preset quantity of fluid is emitted by the spray head 11 at intervals determined and set by a user. This is achieved by actuating the piezoelectric transducer for a predetermined length of time. The piezoelectric transducer is operated at a predetermined AC voltage at a suitable frequency within a predetermined range, in the present example 75-90 kHz. A slide switch 13 allows the user to control how often the spray head 11 emits fluid. The slide switch 13 is a five-position slide switch that the user adjusts to set the time interval between background sprays.

A boost mode is also provided; in this mode, when the user operates push switch 14 the spray head sprays a preset quantity of fluid. Typically, the background spray emits a maximum of 400 mg of fluid per day and the boost mode emits 10 mg of fluid in 10 seconds on activation of the push switch 14.

The air-freshening device 10 is constructed to be power efficient and the device contains a number of features to achieve this. A power supply unit (PSU) 21 provides power for the components on the micro-controller 20, selectively as determined by the micro-controller and indicated by switching the output 211 of the micro-controller. The PSU 21 includes a pair of DC-to-DC converter integrated circuits together with the inductor, diode and capacitors they requires to operate (not shown). One of the DC-to-DC converter integrated circuits is arranged to supply 5 volts from the two "AA" cells 12 to the micro-controller 20. It has very low quiescent power consumption when not under load. To minimise power consumption, the microprocessor is kept in "sleep" mode when not spraying. The PSU 21 also includes a second DC/DC converter which provides a 6 volt signal to a capacitor 22 which is charged to 6 volts and which supplies energy at a voltage ($V_{cap}$) to the power amplifier circuit 23 to drive the spray head 11.

The power amplifier circuit 23 which provides the drive signal to the spray head 11 is configured as a resonant bridge circuit. It requires two digital drive signals in anti-phase at a desired frequency. Operating from the 6-volt power supply, it can generate a drive signal of the order of 40 volts peak-to-peak. A series capacitance of the spray head 11 forms part of the resonant bridge power amplifier circuit.

As an alternative, a resonant power amplifier circuit incorporating a transformer and transistor switching device can be used. This amplifier configuration would require only a single digital drive signal from the microprocessor. This amplifier may include an inductor to match the transformer output to the spray head load.

The background timer 25 is used to set the time interval between the "background" sprays. It also sets the time duration of each spray. The timer 25 is provided by software on the micro-controller 20. The slide switch 13 is connected to the background timer 25 to allow the user to set the interval between each background spray.

Boost timer 24 is also provided through software on the micro-controller. When push switch 14 is pressed, the software executes the boost spray. It splits the fluid to be sprayed into a number of "quanta" of fixed length, with a fixed time interval between each. In this example, each quanta is 1 second, which is repeated 10 times with a 200 ms time gap between each pulse. The 200 ms gap lowers the average flow rate and gives the spray head 11 time to recover between each spray.

The micro-controller 20 has a stable 10 MHz internal frequency generator 26 that is used to generate square wave drive signals at the frequencies required, and with the frequency resolution required to drive the spray head 11. By adjusting the number of CPU clock cycles between output transitions, frequency generator software can generate square waves in the range of 75-90 KHz (which is required for the spray head 11), with a resolution of the order of 1 KHz. Since every other frequency step is an odd number of clock cycles, the duty cycle of the square wave generated is only approximately 50% in these cases. In addition, the micro-controller 20 is programmed to generate dual signals in anti-phase, overlapping by one clock cycle. These overlapping drive signals are required for the power amplifier 23 that drives the spray head 11.

The spray head 11 operates best at its resonant frequency which is in the range of 75-90 KHz, and requires a drive voltage in the order of 40 volts peak-to peak at this frequency. When driven at its resonant frequency, the power consumption of the transducer is at a maximum. To determine this resonant frequency, the time taken for the capacitor 22 to recharge to the supply voltage is measured as follows below.

A high impedance voltage divider is disposed across the capacitor 22 and is designed so that its output voltage is 1.22 volts when the capacitor 22 is fully charged. The voltage divider output (which may be buffered by a suitable low power op-amp, not shown,) is connected to one input of the micro-controller's on-chip comparator and the other comparator input is connected to the micro-controller's on-chip 1.1 volt reference. Software running on the micro-controller is thus able to detect when the output of the voltage divider exceeds 1.1 volts and this indicates that the capacitor 22 is close to being fully charged.

Figure 3:
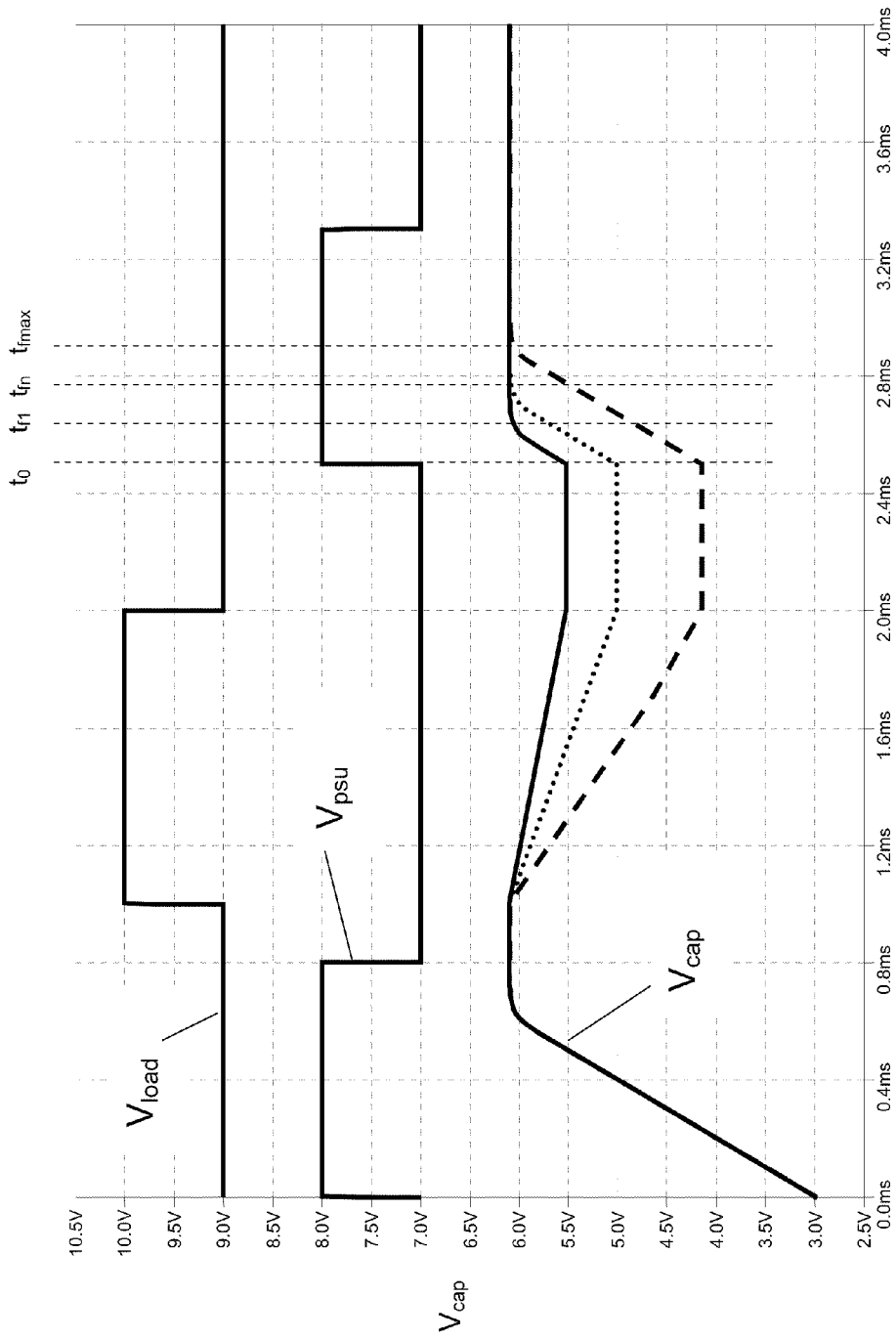
Figure 4:
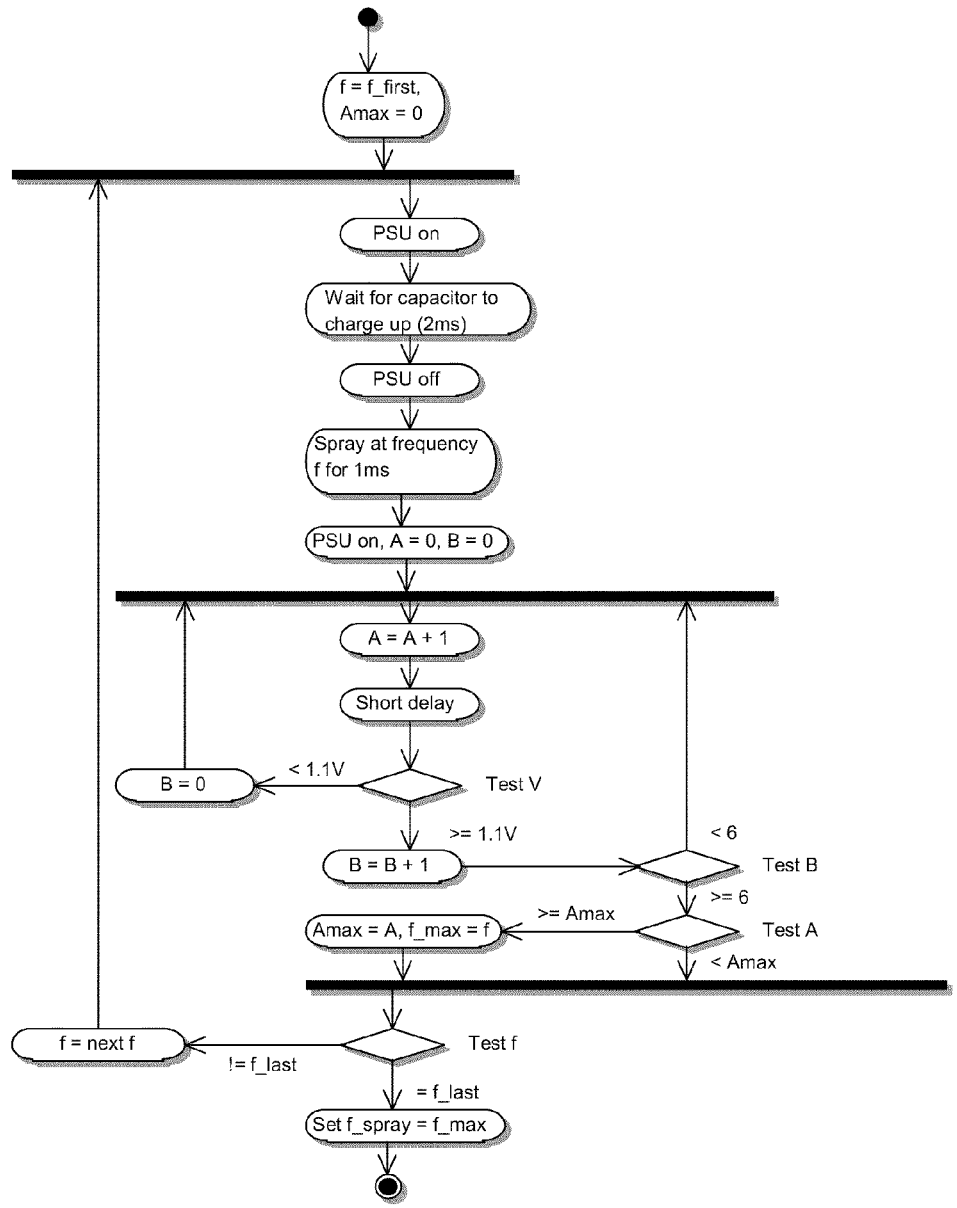

In order to set the operating frequency, the software on the micro-controller measures the time to re-charge of the capacitor and operates the circuitry as follows and as shown in FIG. 3 and FIG. 4. For each of a number of test frequencies f of the voltage ($V_{load}$) applied to the spray head 11, the micro-controller executes a routine as follows:

At time t=0, it switches on the PSU ($V_{psu}$).
It waits for 1 millisecond, known to be greater than the maximum time that the capacitor takes to re-charge.
At time t=0.8 ms, it switches off the PSU ($V_{psu}$).
At time t=1.0 ms, it switches on the amplifier ($V_{load}$) to cause the spray head 11 to spray at the particular test frequency f for 1 millisecond.
At time t=2.5 ms, it switches on the PSU ($V_{psu}$).
Using the on-chip comparator, it looks for six consecutive voltage divider readings greater than 1.1 volts. This helps to reject noise spikes on the voltage divider output and avoid measurement errors.

The micro-controller then stores the value of time to reach this point and the related test frequency f.

If the system has just been switched on, then the routine immediately repeats for each of the test frequencies. Once the system has started operating normally, at appropriate intervals until all the test frequencies have been used, a test spray is carried out at one of the frequencies in the range.

In both cases, once all the frequencies of f have been tested, the micro-controller then sets the operating frequency to be the test frequency f corresponding to the longest capacitor recharge time.

FIG. 3 illustrates the timing of the PSU voltage $V_{psu}$, the load voltage $V_{load}$ applied to the power amplifier 23, and the voltage $V_{cap}$ output by the capacitor (to which the voltage divider output voltage is directly related.) Three graphs of the capacitor output voltage $V_{cap}$ are shown, to illustrate variation of the voltage $V_{cap}$ with changing frequency and hence changing capacitor recharging time, $t_{f1}$-$t_0$, $t_{fn}$-$t_0$, $t_{fres}$-$t_0$, for three different test frequencies, f1 (a first test frequency), fn (an nth test frequency), and fmax (the test frequency established as the resonant frequency).

It has been found that test sprays with short (e.g. 6 millisecond) gaps between them are sufficient at start-up to enable an accurate measurement of the resonant frequency.

As mentioned above, the system has two calibration modes: When the system is switched on, the resonant frequency is unknown. So, before spraying, all frequencies in the range are tested as described above to find the desired operating frequency of the spray head 11. A full calibration measurement such as this makes an audible sound which may provide indicator of proper functioning to the user. When operating, the resonant frequency may to shift, due to variation of circuit parameters with temperature, etc. Therefore, at regular intervals, a different single frequency is selected and a test spray carried out. When all frequencies in the range have been measured, the operating frequency value is updated, and the process restarts. The sound made by such a single point measurement is virtually inaudible due the calibration update being over many background sprays.

A voltage-measuring solution would be similar to the system described above, with the central timing loop replaced by a voltage measurement via the micro-controller's built-in analogue to digital converter. The algorithm would search for the lowest voltage, measured just after the 1 millisecond test spray pulse.

The invention claimed is:

1. An electronic drive system for a droplet spray generation device, the drive system comprising a droplet generator having a perforate membrane driven by a piezoelectric transducer;

an electronic circuit controlling a power supply to control the charging of a capacitor to a supply voltage providing power to a power amplifier connected to receive electric power from the capacitor and supply a drive signal to the piezoelectric transducer in use; and wherein the electronic circuit is also arranged to control the operation of the power amplifier including the drive signal operating frequency at substantially its resonant frequency, where the resonant frequency is calculated by measuring and/or timing changes to the voltage across the capacitor when the droplet generator is operated in a plurality of bursts at different frequencies, by charging the capacitor to a given voltage, and either actuating the droplet generator for a given time and either measuring the voltage drop across the capacitor at the end of the given time or the time taken to recharge the capacitor to the set value thereafter, or actuating the droplet generator and measuring the time taken for the voltage to fall to a known value, and determining as the resonant frequency of the droplet generator, the frequency at which respectively the time to recharge is the greatest, or the voltage drop is the greatest, or the time taken for the voltage to fall to the known value is shortest, and to set the drive signal operating frequency at the resonant frequency thus determined.

2. An electronic drive system according to claim 1, wherein the power amplifier comprises a resonant bridge circuit and the electronic circuit outputs in use a pair of signals in anti-phase to the resonant bridge circuit to control the amplifier.

3. An electronic drive system according to claim 1 wherein the power amplifier comprises a resonant circuit using a transformer, transistor and impedance matching inductor.

4. An electronic drive system according to claim 1, wherein the electronic drive system includes a multi-position switch connected to the electronic circuit to control a timer provided by the electronic circuit to set the interval at which the drive signal is provided to the power amplifier to control the interval at which the droplet generator is automatically operated.

5. An electronic drive system according to claim 4, wherein the electronic circuit provides a second timer to generate the drive signal, on demand, as a plurality of pulses of fixed interval over a predetermined period shorter than the interval at which the droplet generator is automatically operated, the second timer being operated by a mono-stable switch connected to the electronic circuit.

6. A spray generation device including an electronic drive system according to claim 1.

7. An air freshener including an electronic drive system according to any of claim 1.

* * * * *